United States Patent [19]

Watanabe

[11] Patent Number: 5,043,858
[45] Date of Patent: Aug. 27, 1991

[54] HIGH-VOLTAGE GENERATING CIRCUIT HAVING IMPROVED VOLTAGE BOOSTING EFFICIENCY

[75] Inventor: Takeshi Watanabe, Tokyo, Japan
[73] Assignee: NEC Corporation, Tokyo, Japan
[21] Appl. No.: 380,176
[22] Filed: Jul. 13, 1989
[30] Foreign Application Priority Data
Jul. 14, 1988 [JP] Japan ................. 63-176617
[51] Int. Cl.⁵ .............................. H02M 3/07
[52] U.S. Cl. ......................... 363/61; 307/482; 307/110
[58] Field of Search .................... 363/59-61; 307/108, 110, 107, 264, 482, 246; 377/62, 63

[56] References Cited
U.S. PATENT DOCUMENTS
4,616,303  10/1986  Mauthe .......................... 363/60

Primary Examiner—A. D. Pellinen
Assistant Examiner—David Osborn
Attorney, Agent, or Firm—Helfgott & Karas

[57] ABSTRACT

A high-voltage generating circuit for generating a high voltage from a power voltage with a high efficiency is disclosed. The high-voltage generating circuit comprises a series circuit of a plurality of field effect transistors connected in series between a power voltage terminal and a high-voltage output terminal, a plurality of capacitors having one end connected to intermediate nodes of the field effect transistors, and first and second clock signal generators for generating first and second clock signals having larger value than the power voltage and different phases. The first and second clock signals are applied to the other ends of the respective two adjacent capacitors, respectively.

3 Claims, 4 Drawing Sheets

HIGH-VOLTAGE GENERATING CIRCUIT HAVING IMPROVED VOLTAGE BOOSTING EFFICIENCY

BACKGROUND OF THE INVENTION

1. Field of the Invention

The present invention relates to a high-voltage generating circuit for generating a high voltage from a power voltage Vcc, and more particularly to a high-voltage generating circuit suitable for use in a semiconductor integrated circuit driven with a low power voltage.

2. Description of the Related Art

A high-voltage generating circuit which generates a high voltage e.g. 25 V from a supplied power voltage Vcc e.g. 5 V is widely utilized in integrated circuits such as semiconductor non-volatile memory devices (EPROMs). In such an EPROM, although read operations are conducted by use of the power voltage Vcc which is usually 5 V, programming operation for writing data into non-volatile memory cells is performed by a high value of program voltage Vpp usually of 25 V. In order to save the number of external terminals, it has been a practice that a power voltage Vcc supplied from a terminal is used for driving the EPROM and for generating the program voltage Vpp by using a built-in high-voltage generator. A conventional high-voltage generating circuit is basically formed by the so-called charge-pump circuit in which drain-source paths of a plurality of insulated gate field effect transistors having gates connected to their respective drains are connected in series between the power voltage terminal and an output terminal of the program voltage Vpp, and a plurality of capacitors are inserted between each interconnection node of the respective adjacent two transistors and one of two clock lines. A first clock signal and a second clock signal of the opposite phase to the first clock signal are applied to the two clock lines. The first and second clock signals are such clock signals having an amplitude (V$\phi$) of Vcc. Therefore, the high-voltage V$_{out}$ generated at the output terminal is represented as:

$$V_{out} = Vcc + N \cdot (V\phi - V_T)$$

wherein N is a number of the field effect transistors connected in series and V$_T$ is a threshold voltage of the field effect transistors, and V$\phi$ is a value of the first and second clock signals.

As is apparent from the above equation, the voltage V$_{out}$ is determined in proportion to the number N. Therefore, if a high voltage of V$_{out}$ is requested, the numbers of the field effect transistors and the capacitors must be large. Therefore, it is difficult to construct the conventional high-voltage generating circuit by a small number of circuit elements. In other words, efficiency of boosting or increasing a voltage of the conventional high-voltage generating circuit is low.

Moreover, the value of V$\phi$ is usually same as the power voltage Vcc and if the value of the power voltage Vcc is relatively small and a value of (V$\phi$(Vcc) − V$_T$) is small, it is difficult to obtain a large value of increased voltage V$_{out}$, because the factor of (Vcc − V$_T$) is small. Therefore, boosting efficiency of the circuit is very low. Particularly, if the value of the power voltage Vcc is close to the threshold voltage V$_T$, such as 1.5 V, the conventional circuit does not boost the voltage any more.

SUMMARY OF THE INVENTION

It is an object of the present invention to provide a high-voltage generating circuit which can be constructed by a small number of circuit elements.

It is another object of the present invention to provide a high-voltage generating circuit operable in a low-voltage drive integrated circuit.

The high-voltage generating circuit according to the present invention comprises a power voltage terminal receiving a power voltage, an output terminal, first to (N+1)th (N being a positive integer of 2 or more) field effect transistors connected in series between the power voltage terminal and the output terminal, a gate and a drain of the first transistor being connected to the power voltage terminal, gates and drains of the second to (N+1)th transistors, being connected to sources of the following transistors in the series circuit at first to Nth nodes, respectively, first to Nth capacitors having first ends coupled to the first to Nth nodes, respectively, a first clock signal generating circuit for generating a first clock signal oscillating between a reference voltage and a boot voltage larger than the power voltage with a first phase, a second clock signal generating circuit for generating a second clock signal oscillating between the reference voltage and the boot voltage with a second phase different from the first phase, the first clock signal being supplied to second ends of the odd number of the capacitors, and the second clock signal being supplied to second ends of the even number of the capacitors.

According to the present invention, the amplitude of the first and second clock signals is made for large as compared to the conventional clock signals, and therefore, the value of (V$\phi$ − V$_T$) is greatly increased. Therefore, boosting or converting efficiency of the high-voltage generating circuit is increased without increasing a number of the serially connected transistors and capacitors, according to the present invention.

Furthermore, since the clock signals have the voltage larger than the power supply by the threshold voltage of the field effect transistors, the high-voltage generating circuit according to the present invention is fully operable in a circuit driven with a low power voltage.

BRIEF DESCRIPTION OF THE DRAWINGS

The above and further objects, features and advantages of the present invention will become more apparent from the following detailed description taken in conjunction with the accompanying drawings, wherein.

DETAILED DESCRIPTION OF THE INVENTION

Prior Art

Figure 1:
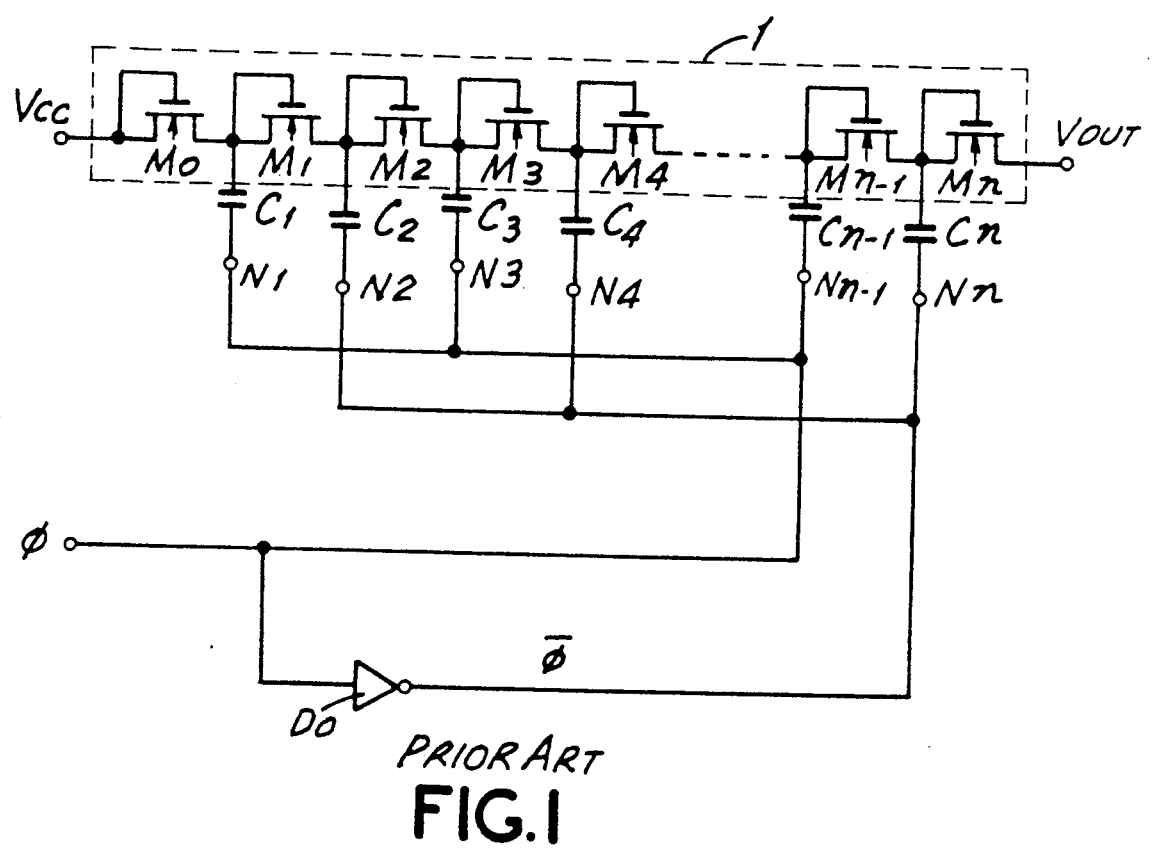
FIG. 1 is a schematic circuit diagram showing the conventional high-voltage generating circuit.

With reference to FIG. 1, the conventional high-voltage generating circuit will be explained.

The high-voltage generating circuit has a series circuit 1 composed of a plurality of insulated gate field-effect transistors (hereinafter referred to as IGFET's) $M_0$ to $M_n$, and capacitor elements $C_1$ to $C_n$ connected at their one ends to intermediate nodes of the series circuit 1.

In the following explanation, it is assumed that the IGFET's are N-channel type transistors and the power voltage Vcc is of a positive polarity.

A control clock $\phi$ and a control clock $\overline{\phi}$ generated by an inverter $D_0$ and having an opposite phase to $\phi$ are supplied to the other ends of the capacitor elements $C_1$ to $C_n$, as illustrated in FIG. 1. The power voltage Vcc is input to one end of the series circuit 1 and the boosted voltage $V_{out}$ is produced at the other end of the series circuit 1. Here, the clocks $\phi$ and $\overline{\phi}$ swing between the ground voltate 0 V and the power voltage Vcc maintaining a phase difference.

In the above-mentioned conventional high-voltage generating circuit, when Vcc is about 5 V, $V_{out}$ is as high as 20 to 30 V. However, the value of $V_{out}$ suddenly decreases as Vcc becomes low. This is because, the boosted voltage $V_{out}$ is determined by the number N of the IGFET's $M_0$-$M_n$ connected in series, by the amplitude voltage $V\phi$ (which in this case is equal to Vcc) of the clocks $\phi$, $\overline{\phi}$, and by the threshold voltage $V_T$ of IGFET's as given by, $$V_{out} \approx N \cdot (V\phi - V_T)$$

$$V_T = V_{TO} + K \cdot V_{out}$$

where $V_T$ denotes a threshold voltage of IGFET's during the operation including an increment of threshold voltage formed by a potential difference between the semiconductor substrate and the source, and $V_{TO}$ denotes a threshold voltage of IGFET when the potential difference is zero between the semiconductor substrate and the source.

Generally, $V_T$ is approximately 1.5 V when $V_{TO} \approx 0.8$ V and $V_{out} = 20$ V. From the above relationship, therefore, $V_{out} = 0$ V when both of Vcc and $V\phi$ are smaller than 1.5 V. When Vcc and $V\phi$ are 1.5 to 3.0 V, furthermore, N must be sufficiently increased to obtain $V_{out}$ which is comparable to that of when Vcc = 5.0 V.

For example, in an electrically write/erasable ROM (EEPROM) formed as a semiconductor device with a built-in high-voltage generating circuit, data is written or is erased using a program voltage generated by the high-voltage generating circuit such as shown in FIG. 1 which generates a high voltage of about 25 V that is necessary for writing or erasing data. However, it is difficult to decrease the power voltage Vcc to be lower than 5 V because of the reasons described above. Therefore, it is difficult to realize the operation on a voltage as small as about 1.5 V such as of a cell which is requested in the market.

EMBODIMENT OF THE INVENTION

Figure 2:
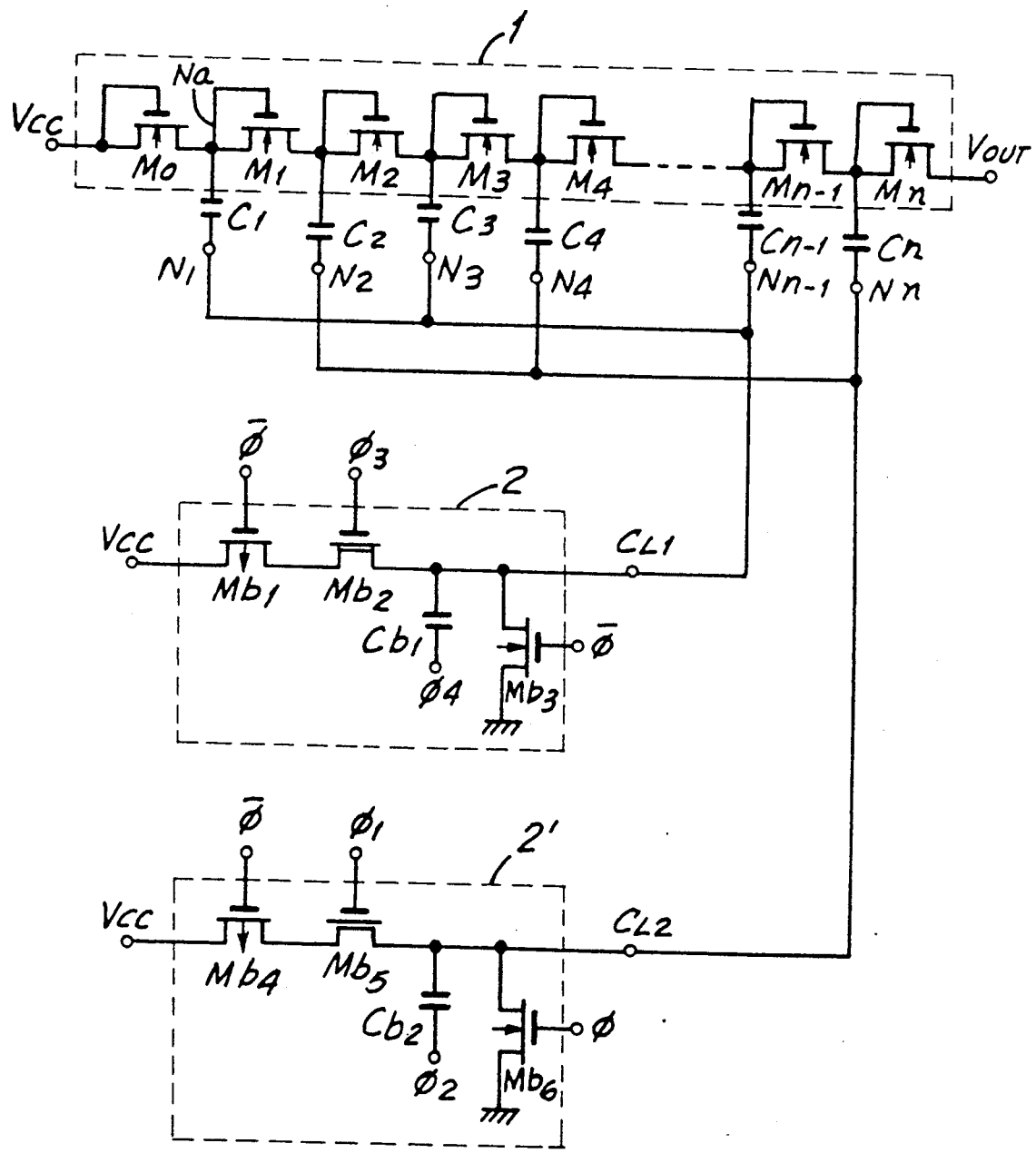
FIG. 2 is a schematic circuit diagram showing a high-voltage generating circuit according to one embodiment of the present invention.

With reference to FIG. 2, the high-voltage generating circuit according to one embodiment of the present invention will be explained.

In FIG. 2, the elements or portions corresponding to those in FIG. 1 are denoted by the same or similar references.

The high-voltage circuit of the present embodiment comprises the series circuit 1 of IGFET's $M_0$-$M_n$ which have drains connected to their gates in a diode connection manner, connected in series between the power voltage terminal Vcc and the boosted voltage output terminal $V_{out}$, the capacitor elements $C_1$-$C_n$ having one ends connected to the intermediate nodes of the series circuit 1 and the other ends connected to nodes $N_1$-$N_n$, respectively, and control signal generating circuits 2 and 2' generating control clock signals $CL_1$ and $CL_2$ having the opposite phases from each other and swing between the ground potential and 2 Vcc. The control clock signal $CL_1$ is applied to the nodes $N_1$, $N_3$ ... $N_{n-1}$ of the odd number while the control clock signals $CL_2$ is applied to the nodes $N_2$, $N_4$ ... $N_n$ of the even number. The present embodiment is thus featured in that in place of the clock signals $\phi$ and $\overline{\phi}$ swinging between the ground potential and Vcc of FIG. 1, the clock control signals $CL_1$ and $CL_2$ swinging between the ground potential and 2·Vcc are employed in this embodiment.

The above-mentioned control clock signal generating circuit 2 generating the control clock signal $C_{L1}$ includes a p-channel IGFET $M_{b1}$ which has a source connected to the power source voltage terminal Vcc, a gate connected to the clock $\overline{\phi}$ and its substrate biased at Vcc, an n-channel depletion-type IGFET $M_{b2}$ which has a source connected to the drain of $M_{b1}$, and a gate connected to receive a clock $\phi_3$, an n-channel IGFET $M_{b3}$ which has a drain connected to the terminal $C_{L1}$, a gate receiving $\overline{\phi}$, and a source grounded, and a capacitor element $C_{b1}$ connected at its one end to the terminal $C_{L1}$ and connected at its other end to receive a clock $\phi_4$. The control signal generating circuit 2' generating the control clock signal $C_{L2}$ includes a p-channel IGFET $M_{b4}$ which has a source connected to the power source voltage terminal Vcc, a gate connected to receive $\phi$, and its substrate biased at Vcc, an n-channel depletion-type IGFET $M_{b5}$ which has a source connected to the drain of $M_{b4}$ and a gate connected to receive the clock $\phi_1$, an n-channel IGFET $M_{b6}$ which has a drain connected to the terminal $C_{L2}$, a gate connected to receive $\phi$ and a source grounded, and a capacitor element $C_{b2}$ which is connected at its one end to the terminal $C_{L2}$ and is connected at its other end to receive a clock $\phi_2$.

Figure 3:
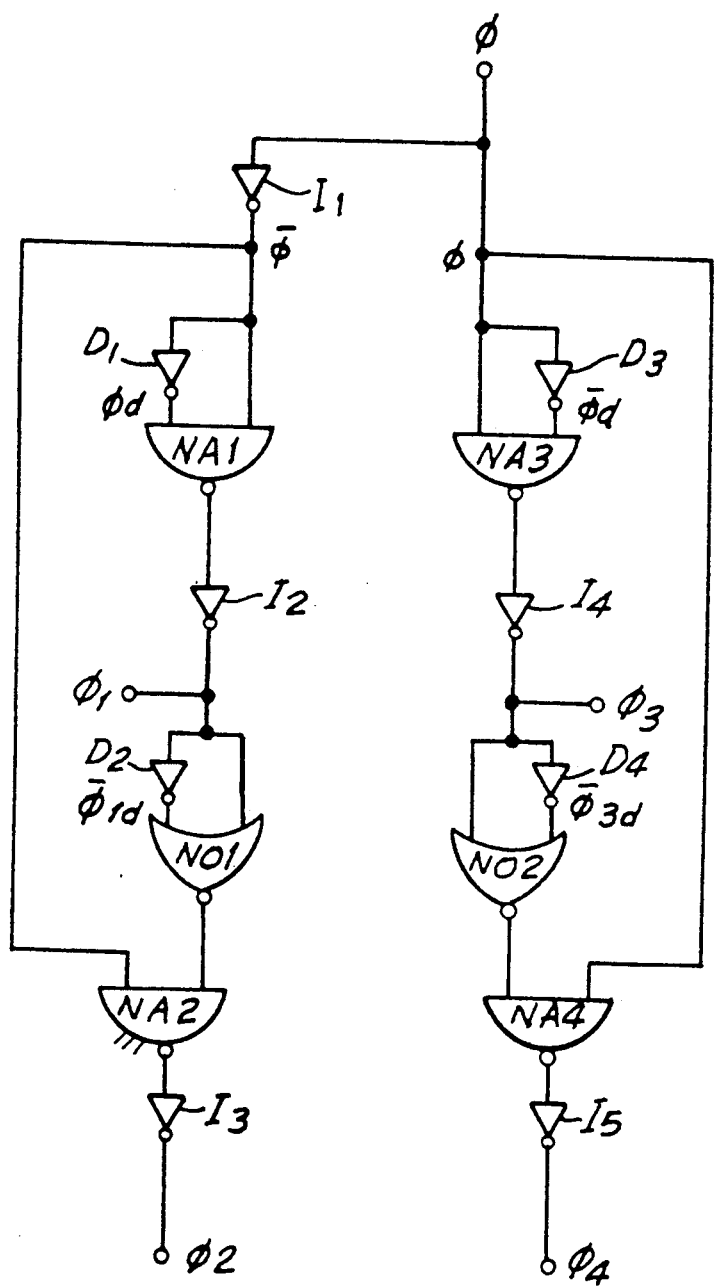
FIG. 3 is a schematic block diagram showing an example of a clock signal generating circuit for generating clock signals to be used by FIG. 2 circuit.

An example of a signal generator circuit for generating the clock signals $\phi_1$, $\phi_2$, $\phi_3$ and $\phi_4$ by the clock $\phi$ is shown in FIG. 3.

Referring to FIG. 3, the signal generating circuit comprises an inverter $I_1$ which generates the clock $\overline{\phi}$ from the basic clock $\phi$ that periodically oscillates between the power source voltage Vcc and 0 V, an inversion delay circuit D1 which receives $\overline{\phi}$ and produces $\overline{\phi}d$, a NAND circuit NA1 which receives $\overline{\phi}$ and $\overline{\phi}d$, an inverter $I_2$ which receives the output of NA1 and produces $\phi_1$, an inversion delay circuit D2 which receives $\phi_1$ and produces $\overline{\phi_{1d}}$, a NOR circuit NO1 which receives $\phi_1$ and $\overline{\phi_{1d}}$, a NAND circuit NA2 which receives the output of NO1 and $\phi$, and an inverter $I_3$ which receives the output of NA2 and produces $\phi_2$. The signal generating circuit further comprises an inversion delay circuit $D_3$ which receives $\phi$ and produces $\overline{\phi d}$, a NAND circuit NA3 which receives $\phi$ and $\overline{\phi d}$, an inverter $I_4$ which receives the output of NA3 and produces $\phi_3$, an inversion delay circuit $D_4$ which receives $\phi_3$ and produces $\overline{\phi_{3d}}$, a NOR circuit NO2 which receives $\phi_3$ and $\overline{\phi_{3d}}$, a NAND circuit NA4 which receives the output of NO2 and $\phi$, and an inverter $I_5$ which receives the output of NA4 and produces $\phi_4$.

Operation of the high-voltage generating circuit of the embodiment will now be described in conjunction with FIG. 4.

Figure 4:
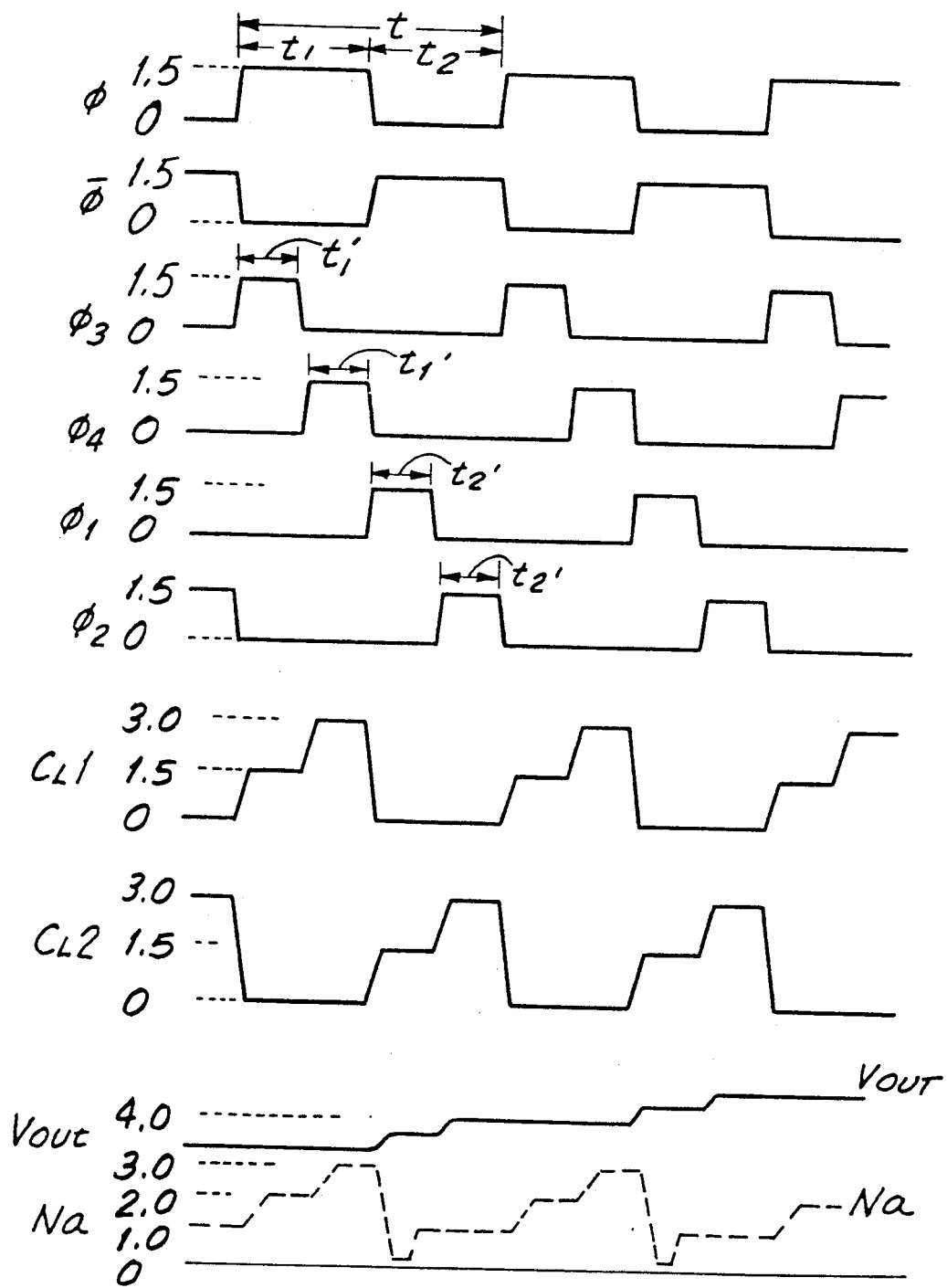
FIG. 4 is a timing diagram showing operation of the circuit of FIG. 2.

FIG. 4 is a timing diagram of various signal voltages and node voltages for explaining the operation of the circuit of FIG. 2. Described here is the case where the power source voltage Vcc is about 1.5 V.

Referring to FIG. 4, the basic clock $\phi$ oscillates between 0 V and 1.5 V at a period t, and the time in which the basic clock $\phi$ is at 1.5 V is denoted by $t_1$ and the time in which the basic clock $\phi$ is at 0 V is denoted by $t_2$. The inversed basic clock $\overline{\phi}$ has the same period t, and the time in which it is at 1.5 V is denoted by $t_2$ and the time in which it is at 0 V is denoted by $t_1$. The clock $\phi_3$ is also repeated at a period t, and changes from 0 V to 1.5 V in synchronism with the basic clock $\phi$ that changes from 0 V to 1.5 V. The time $t_1'$ in which the clock $\phi_3$ is maintained at 1.5 V is set by the delay time of the inversion delay circuit $D_3$. After the time $t_1'$, therefore, the clock $\phi_3$ changes from 1.5 V to 0 V. The clock $\phi_4$ changes from 0 V to 1.5 V as the clock $\phi_3$ changes from 1.5 V to 0 V, remains at 1.5 V until the basic clock $\phi$ breaks from 1.5 V to 0 V, and then changes to 0 V. This time is denoted by $t_1''$. Similarly, the clock $\phi_1$ remains at 1.5 V during the period $t_2'$ and remains at 0 V in other periods. Further, the clock $\phi_2$ remains at 1.5 V during the period $t_2''$ and remains at 0 V in other periods. As described above, the clocks $\phi_1$ to $\phi_4$ are generated as signals by dividing the time by the basic clock $\phi$, and oscillate between 0 V and 1.5 V maintaining the same period as the basic clocks $\phi$.

Described below is the operation when the above-mentioned clocks ($\phi$, $\overline{\phi}$, $\phi_1$ to $\phi_4$) are applied to the high-voltage generating circuit of FIG. 2 in conjunction with FIG. 4.

The control clock signal $C_{L1}$ will be described, first. During the period $t_1'$, $\phi = \phi_3 = 1.5$ V and other signals are at 0 V. Therefore, IGFET's $M_{b1}$ and $M_{b2}$ are conductive and IGFET $M_{b3}$ is nonconductive. The signal $C_{L1}$ therefore assumes the potential Vcc (1.5 V). In the next period $t_1''$, the clock $\phi_3$ changes from 1.5 V to 0 V and $M_{b2}$ becomes nonconductive. Further, since $\phi_4$ rises from 0 V to 1.5 V, the signal $C_{L1}$ is boosted from 1.5 V to 3.0 V via capacitor element $C_{b1}$ in response to rise of $\phi_4$. At this moment, $M_{b2}$ and $M_{b3}$ connected to the control signal terminal $C_{L1}$ are both nonconductive, and the signal $C_{L1}$ remains at 3.0 V for a period $t_1''$. Next, during the periods $t_2'$ and $t_2$, i.e., during the period $t_2''$, the clock $\phi$ is at 1.5 V and $\phi_3$ is at 0 V and whereby $M_{b1}$ and $M_{b2}$ are nonconductive, and $M_{b3}$ is conductive, so that $C_{L1}$ is at 0 V.

As for the control signal $C_{L2}$, 0 V is assumed during the period $t_1$ like the above-mentioned signal $C_{L1}$, 1.5 V is assumed during the period $t_2'$ and 3.0 V is assumed during the period $t_2''$. Here, Na represents voltage waveforms at a nodal point of the transistors $M_0$ and $M_1$ in FIG. 2.

Thus, the two boosted control clock signals $C_{L1}$ and $C_{L2}$ having different phases oscillate between 0 V and 3 V (2 Vcc), and are supplied to the other terminals $C_1$ to $C_n$ of the series circuit 1 of FIG. 2. Therefore, the signals $C_{L1}$ and $C_{L2}$ assumed 3.0 V, and a boosted output $V_{out}$ is obtained even when Vcc = 1.5 V, and the number of the IGFET's $M_0$-$M_n$ is small.

As described above, the present invention employs a circuit which boosts two control signals that are input to the series circuit, in order to obtain control signals boosted to be greater than the power source voltage. Therefore, a high voltage is obtained even with a power source of a low voltage, and a stable operation is realized.

What is claimed is:

1. A higher voltage generating circuit comprising a power voltage terminal receiving a power voltage, an output terminal, a series circuit of first to (N+1)th field effect transistors wherein N is a positive integer of 2 or more, said field effect transistors having drain-source paths connected in series between said power voltage terminal and said output terminal, a gate and a drain of said first transistor being connected to said power voltage terminal, gates and drains of said second to (N+1)th transistors being connected to sources of the following transistors in said series circuit at first to Nth nodes, respectively, first to Nth capacitors having first ends coupled to said first to Nth nodes, respectively, clock signal generating circuit means for generating a first clock signal having a pulse height of a high voltage which is larger than said power voltage and having a first phase and a second clock signal having said pulse height but having a second phase different from said first phase, first means for applying said first clock signal to second ends of the odd numbers of said capacitors, and second means for applying said second clock signal to second ends of the even numbers of said capacitors, wherein each of said first and second clock signal is generated, respectively, by a clock generating circuit including first and second transfer field effect transistors connected in series between said power voltage terminal and an output end, a charge capacitor having a first end connected to said output end and a clamp field effect transistor connected between said output end and a voltage node receiving a reference voltage.

2. The high-voltage generating circuit according to claim 1, in which a value of said high voltage has a voltage higher than said power voltage by a threshold voltage of said field effect transistors.

3. The high-voltage generating circuit according to claim 1, in which said first phase is substantially opposite to said second phase.

* * * * *